(12) United States Patent
Ensher et al.

(10) Patent No.: US 8,964,806 B2
(45) Date of Patent: Feb. 24, 2015

(54) SYSTEM AND METHOD FOR GENERATING AN OPTIMUM SIDE-MODE SUPPRESSION RATIO CONTINUOUS TUNING PATH FOR A SEMICONDUCTOR TUNABLE LASER

(71) Applicant: Insight Photonic Solutions, Inc., Lafayette, CO (US)

(72) Inventors: Jason Ensher, Broomfield, CO (US); Dennis Derickson, Broomfield, CO (US); Michael Minneman, Broomfield, CO (US); Michael Crawford, Broomfield, CO (US); Chris Chiccone, Broomfield, CO (US)

(73) Assignee: Insight Photonic Solutions, Inc., Lafayette, CO (US)

( * ) Notice: Subject to any disclaimer, the term of this patent is extended or adjusted under 35 U.S.C. 154(b) by 12 days.

(21) Appl. No.: 13/746,354

(22) Filed: Jan. 22, 2013

(65) Prior Publication Data

US 2013/0223461 A1 Aug. 29, 2013

Related U.S. Application Data

(60) Provisional application No. 61/588,374, filed on Jan. 19, 2012.

(51) Int. Cl.
| | |
|---|---|
| *H01S 3/00* | (2006.01) |
| *H01S 5/00* | (2006.01) |
| *G01R 19/00* | (2006.01) |
| *H01S 5/0625* | (2006.01) |
| *H01S 5/06* | (2006.01) |
| *H01S 5/0683* | (2006.01) |
| *H01S 5/0687* | (2006.01) |

(52) U.S. Cl.
CPC .............. *H01S 5/0014* (2013.01); *G01R 19/00* (2013.01); *H01S 5/06256* (2013.01); *H01S 5/0617* (2013.01); *H01S 5/0683* (2013.01); *H01S 5/0687* (2013.01)
USPC ....... 372/38.02; 372/20; 372/38.07; 372/50.1

(58) Field of Classification Search
CPC . H01S 5/06256; H01S 5/0014; H01S 5/0617; H01S 5/0687; H01S 5/0683; G01R 19/00
USPC ...................... 372/20, 38.02, 38.07
See application file for complete search history.

(56) References Cited

U.S. PATENT DOCUMENTS

| | | | |
|---|---|---|---|
| 4,896,325 A | 1/1990 | Coldred | |
| 6,064,681 A * | 5/2000 | Ackerman | ....................... 372/32 |
| 7,468,997 B2 | 12/2008 | Jayaraman | |
| 2002/0181521 A1 * | 12/2002 | Crowder et al. | ........... 372/38.02 |
| 2003/0147442 A1 * | 8/2003 | Larson et al. | ................... 372/50 |
| 2006/0109879 A1 * | 5/2006 | Farrell et al. | ............... 372/38.07 |

OTHER PUBLICATIONS

V. Jayaraman, Z.M. Chuang, and L.A Coldren, "Theory, Design and Performance of Extended Tuning Range Semiconductor Lasers with Sampled Gratings," IEEE Journal of Quantum Electronics, vol. 29, No. 6, pp. 1824-1834, Jun. 1993.

(Continued)

*Primary Examiner* — Yuanda Zhang
(74) *Attorney, Agent, or Firm* — Renner, Otto, Boisselle & Sklar, LLP.

(57) ABSTRACT

A system and method to determine data sets of front mirror current, back mirror current and phase current that change the wavelength output by a semiconductor laser in a prescribed trajectory versus time, while maintaining the maximum side-mode suppression ratio at each point during the sweep.

8 Claims, 4 Drawing Sheets

(56) References Cited

OTHER PUBLICATIONS

V. Jayaraman, M.E. Heimbuch, L.A. Coldren, and S.P. Denbaars, Widely Tunable Continuous-Wave InGaAsP/InP Sampled Grating Lasers, Electronics Letters, vol. 30, No. 13, pp. 1492-1493, Sep. 1, 1994.

Naoki Fujiwara, "143-nm Swept Source for OFDR-OCT Utilizing TDC-SSG-DDR Lasers", NTT Technical Review, vol. 7, No. 1, Jan. 2009.

* cited by examiner

SYSTEM AND METHOD FOR GENERATING AN OPTIMUM SIDE-MODE SUPPRESSION RATIO CONTINUOUS TUNING PATH FOR A SEMICONDUCTOR TUNABLE LASER

TECHNICAL FIELD

The present invention relates generally to a system and a method for generating an optimum side-mode suppression ratio continuous tuning path for a semiconductor tunable laser. Such a system and method provides improved performance in systems using a swept tunable laser, such as optical coherence tomography (OCT), optical frequency domain reflectometry (OFDR), spectroscopy, remote sensing and testing of telecommunication testing equipment, for example.

BACKGROUND

Most swept-wavelength lasers calibrate one or more control parameters to the output wavelength, with limited control over the presence of additional longitudinal modes of the laser cavity (e.g., side modes). Side modes can reduce the effectiveness of the laser for interferometric measurements by limiting the dynamic range of the fringes. In a telecommunications testing or sensing application, excessive side modes may limit the minimum detectable power through a component, or create a blurring of the edges of a device being characterized. The metric for measuring the amplitudes of side modes is the side mode suppression ratio (SMSR), which is the ratio of the largest side mode relative to the primary mode of the laser.

In monolithic semiconductor lasers comprising multiple sections, the laser control parameters provide more control over the wavelength and SMSR. Examples of these lasers are vernier-tuneable distributed Bragg Reflector lasers (VTDBRs), which include back mirror, gain, phase, and front mirror sections. The laser may also have a section outside the laser cavity for amplification, sometimes called a Semiconductor Optical Amplifier (SOA).

SUMMARY

The present invention provides a system and a method for calibrating the output wavelength of a multi-section, monolithic semiconductor laser and also for maximizing the SMSR of the laser at the output wavelengths. Swept-wavelength measurements performed with a laser calibrated in accordance with aspects of the present invention will provide measurements with superior signal-to-noise ratio and dynamic range than conventional lasers or lasers used without such a calibration.

One aspect of the present invention is directed to a laser system including: a multi-section semiconductor laser comprising a front mirror section, a back mirror section and a phase section, wherein the laser is operable to discretely sweep over a range of wavelengths; one or more current sources for outputting a current to at least one of the front mirror section, the back mirror section and the phase section; an external power meter coupled to the laser; an external wavelength meter coupled to the laser; a controller coupled to the laser, the external power meter and the external wavelength meter, wherein the controller is configured to determine a side-mode suppression ratio for each wavelength in the range of wavelengths and to output control signals to the one or more current sources to drive the laser through an optimum sweep path, wherein the optimum sweep path maximizes side-mode suppression ratio over the range of wavelengths.

Another aspect of the invention relates to a method for collecting and processing data from a semiconductor laser source to produce an optimized side-mode suppression ratio over a continuous range of wavelengths within a prescribed temporal profile, wherein the semiconductor laser source includes a front mirror section, a back mirror section, a phase section and a gain section, the method including: measure laser data over the range of wavelengths, wherein the laser data includes at least one of a voltage, wavelength or power for front mirror current and back mirror current for one or more phase currents; storing the laser data in a data set; identifying laser mode bounded-regions from the data set, wherein each bounded-region is defined as a function of front mirror current and back mirror current; identifying one or more supermodes from the data set, wherein the laser supermodes are comprised of adjacent laser modes spaced along a diagonal in a tuning map having front mirror current indexed on a first axis and back mirror current indexed on a second axis; identifying at least one continuous supermode trajectory in front mirror current and back mirror current between each mode of the laser supermodes; measure gain voltage associated with the gain section and/or output power of the semiconductor laser for each of the at least one continuous supermode trajectory; determine a center for each mode boundedregion for each data set; measure an output wavelength of the laser source at the center of each mode and store the measurements in the data set; sort the measurements based on mode bounded-region for each supermode trajectory; generate a tuning table for the wavelength range of laser source; sort the measurements by wavelength; and interpolating between the measured wavelengths at the mode centers to create the prescribed trajectory of laser wavelength versus data point.

A number of features are described herein with respect to embodiments of the invention; it will be appreciated that features described with respect to a given embodiment also may be employed in connection with other embodiments.

The invention includes the features described herein, including the description, the annexed drawings, and, if appended, the claims, which set forth in detail certain illustrative embodiments. These embodiments are indicative, however, of but a few of the various ways in which the principles of the invention may be employed.

DESCRIPTION

Figure 1:
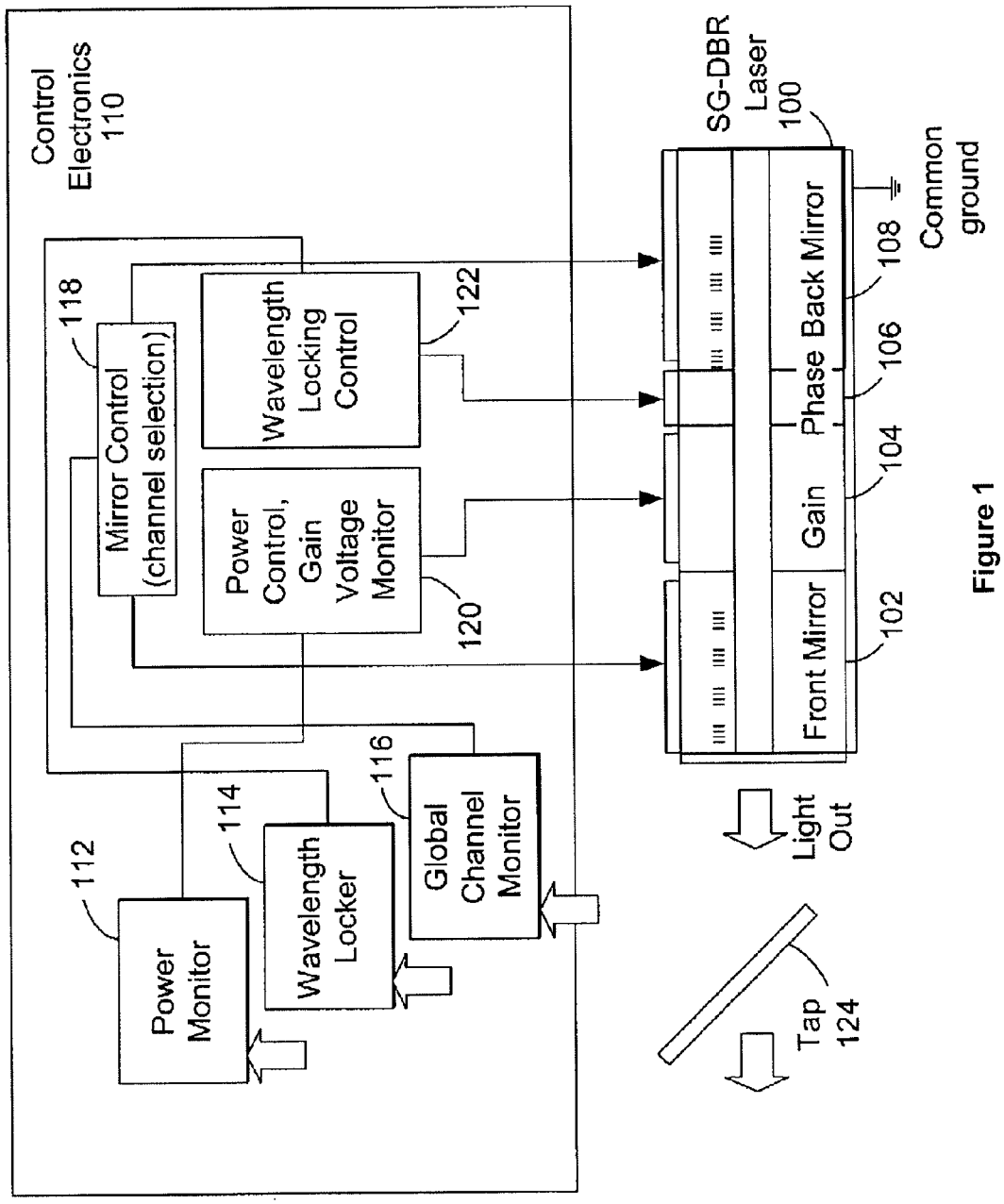
FIG. 1 is a conventional system.

FIG. 1 is a schematic diagram of a multi-section SGDBR laser 100 containing two or more current-controlled, tunable, wavelength-selective elements, as identified in U.S. Pat. No. 6,868,100. Specifically, the SGDBR laser 100 includes front mirror 102, gain 104, phase 106, and back mirror 108 sections. Also shown in FIG. 1 are control electronics 110, which typically contain feedback components, including a power monitor 112, wavelength locker 114 and global channel monitor 116, as well as control components, including mirror control 118, power control and gain voltage monitor 120 and wavelength locking control 122.

An output beam generated by the laser 100 is tapped 124 into the power monitor 112, wavelength locker 114 and global channel monitor 116, which generate feedback signals for the mirror control 118, power control and gain voltage monitor 120 and wavelength locking control 122, respectively. The mirror control 118 uses the feedback signal from the global channel monitor 116 to control the amount of current into the front and back mirrors 102, 108; the power control and gain voltage monitor 120 uses the feedback signal from the power monitor 112 to control the amount of current into the gain section 104; and the wavelength locking control 122 uses the feedback signal from the wavelength locker 114 to control the amount of current into the phase section 106.

The multi-section laser 100 may be tuned with a variety of tuning sections. For example, front mirror (FM), back mirror (BM) and phase currents may be separately tuned. External or internal observables such as output power or voltage across the gain section indicate the extent of the laser mode across the three-dimensional space of FM, BM and Phase currents. Note, a fourth dimension is also available, e.g., the gain current, but this modifies the output power and gain voltage, thereby complicating the use of these observables for mode identification.

In the research literature, such as Sarlet, Morthier and Baets, *Journal of Lightwave Technology*, 18, 1128 (2000), the output power attains a local maximum and the gain section voltage a local minimum in a single mode of the laser. At the boundaries of a mode in the tuning space, the observables change rapidly as the laser transitions from one single-longitudinal mode to another.

The local extrema in power or gain voltage indicate where the SMSR of the mode is highest. The precise location of the optimum SMSR may be determined from the gain voltage or output power via a number of algorithms. Such algorithms include, for example, computing the mean distance from the edges of the bounded-region enclosing a mode; computing the centroid of the mode bounded-region; and finding the extrema in voltage or power inside the mode bounded-region.

One aspect of the present invention is to determine the data sets of FM, BM and phase currents that change the wavelength in a prescribed trajectory versus time, while maintaining the maximum SMSR at each point during the sweep.

This invention is distinct from and improves upon the prior art, such as U.S. Pat. No. 6,868,100, in a variety of ways. For example, one aspect of the present invention describes a method and apparatus for controlling a multi-section laser through three currents (FM, BM and phase), rather than only two (FM, BM) during the tuning from an initial wavelength to a final wavelength. Another aspect of the present invention explicitly seeks to maximize SMSR at all points from an initial wavelength to a final wavelength. Another aspect of the invention relates to a method for combining tuning along multiple supermode paths to create monotonic, prescribed wavelength sweeps versus time across a substantial portion of the tunable wavelengths of the laser.

Figure 2:
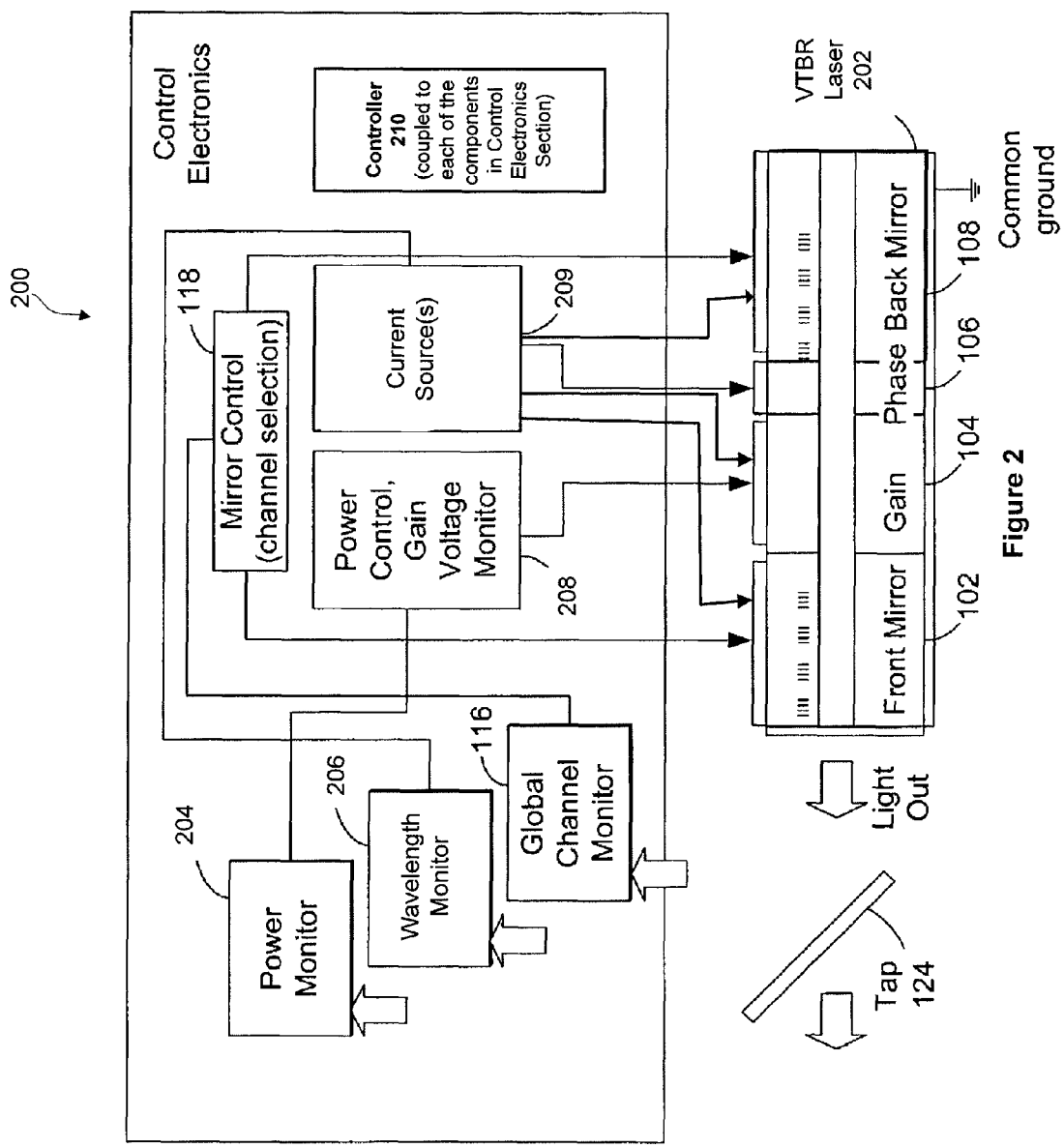
FIG. 2 is an exemplary system in accordance with aspects of the present invention.

Referring to FIG. 2, a system 200 is illustrated for creating an SMSR-optimized, continuous sweep. The system 200 includes a multi-section laser 202, such as a Vernier Tunable Distributed Bragg Reflector (VTDBR) that is coupled to an external power meter 204 and external wavelength meter 206 or an optical spectrum analyzer, for example. The gain section of the VTDBR may be coupled to a voltage measurement device 208, such as a Digital Multi Meter (DMM) or the like.

The sections of the VTDBR may be driven with current from one or more current sources 209 that produce programmed current versus time output signals. A controller 210 (e.g., a microcontroller, processor, computer, field programmable gate array, etc.) is operable to control each component of the system 200. For example, the controller 210 is operable to set the drive currents to the various sections of the VTDBR and monitoring the voltage from the voltage measurement device 208, the power from the optical power meter 204 and the wavelength from the wavelength meter 206.

The controller 210 is also configured to execute one or more algorithms to process data used in the system 200. Such data may include drive current values associated with the VTDBR, voltage measured from the voltage measurement device 208, power measured from the optical power meter 204 and wavelength values measured from the wavelength meter 20, for example. The one or more algorithms may be used to process the data and identify combinations of drive currents that produce the desired sweep of currents versus time.

Figure 3:
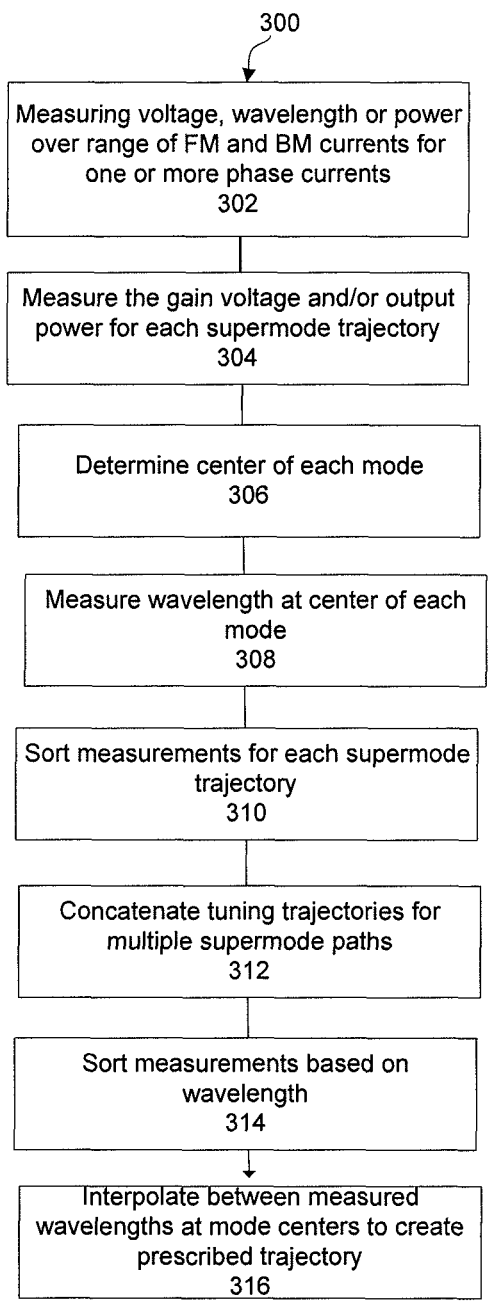
FIG. 3 is an exemplary method in accordance with aspects of the present invention.
Figure 4:
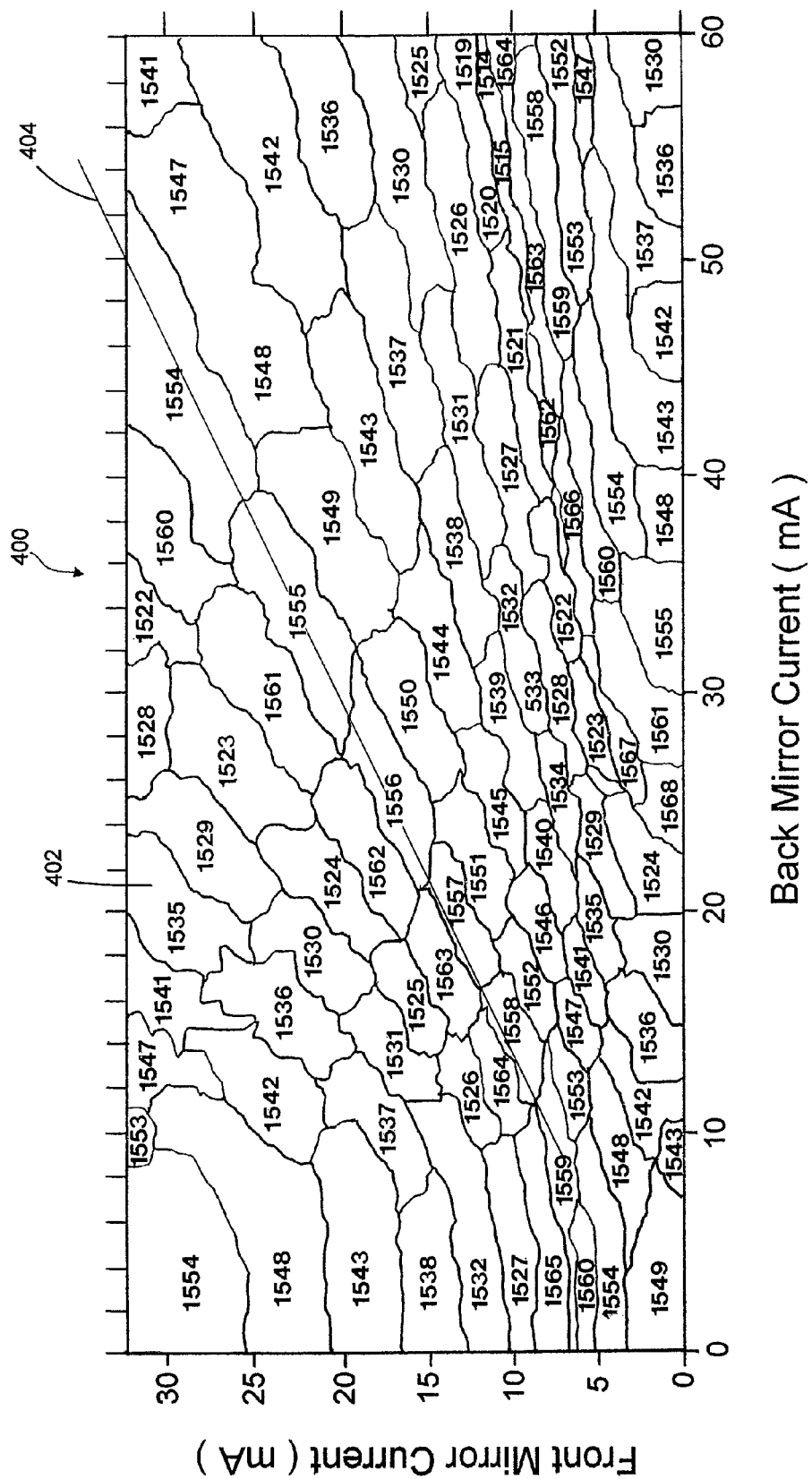
FIG. 4 is an exemplary chart of Tuning Map-Wavelength vs. Mirror Excitation with front mirror current (mA) versus back mirror current (mA).

Referring to FIG. 3, an exemplary method 300 for collecting and processing data from the VTDBR to produce an SMSR optimized, continuous sweep signal with a prescribed temporal profile is illustrated. At block 302, the method includes measuring the voltage, wavelength or power over the range of the FM and BM currents for one or more phase currents. One or more laser modes may be identified using the mean of the mode bounded-region, the centroid of the mode bounded-region, or the local extreme inside the mode bounded-region. The supermodes of the laser may then be identified. FIG. 4, is an exemplary graph that illustrates a mode map 400 for a VTDBR laser 100. The mode map 400 comprises a two dimensional plot of the front and back mirror 102, 108 currents, or some linearized mapping thereof. Mode maps 400 are typically obtained by exhaustive raster scanning of both front and back mirror 102, 108 currents, while holding the other sections 104, 106 fixed or under feedback control, for example.

Each cell-like area in the graph is a cavity mode 402, wherein adjacent cavity modes 403 lying along a diagonal are accessed by the same set of mirror 102, 108 peaks and are called a supermode trajectory 404. The supermode trajectory 404 may comprise a single line, segments connecting centers of mode bounded-regions, or a smooth curve traversing the mode bounded-regions. The graph illustrates boundaries between cavity modes 402, which are separated by discontinuities in device characteristics or their derivatives, such as external parameters of wavelength, output power, etc., or internal parameters of voltage for constant current-driven sections, current for constant voltage-driven sections, or either current or voltage for sections driven under additional feedback control. The graph may also include characteristics such as wavelength, power, voltage, etc., associated with all points in the space or with some sampling thereof, such as the center point of each cavity mode 402.

A continuous supermode trajectory 404 in FM and BM that connects the mode centers is identified and stored as a data set.

At block 304, for each supermode trajectory 404 data set, at a fixed phase current, the gain voltage and/or output power is measured and stored with the data set. These measurements may be repeated over a range of phase currents.

At block 306, for each data set (e.g., FM, BM, and Phase that are observed), the center of each of the modes may be determined in a number of ways. Exemplary methods for determining the center of each of modes includes: determining the mean of the boundaries of the mode bounded-region;

determining a centroid of the mode bounded-region; and determining the extreme value inside the mode bounded-region, for example.

At block 308, the wavelength of the laser source at the center of each mode polygon is measured.

At block 310, at each supermode trajectory data set, sort the measurements by mode bounded-region. One or more of the following criterion may be used to sort the measurements: 1) each mode should tune over as wide a wavelength range as possible within the tuning range of the currents; and 2) at the same time, sufficient overlap should exist between adjacent modes to insure no gaps in wavelength tuning.

At block 312, tuning trajectories for multiple supermode paths may be concatenated, which creates a tuning table covering the complete tuning range of the laser. For example, at the ends of a supermode path, extrapolate the trajectory beyond the last measured mode bounded-region by using the previous mode as an estimate for the side of the mode.

At block 314, the measurements are sorted by wavelength. One or more of the following criterion may be used for the sorting process: 1) maintain monotonicity of the tuning of wavelength; and 2) wavelength may increase or decrease.

At block 316, interpolate between the measured wavelengths at the mode centers to create the prescribed trajectory of laser wavelength versus data point. The prescribed trajectory defines the change in optical wavelength between each interpolated data point. In one embodiment, a preferred trajectory may be a linear interpolation of wavelength versus data point. In another embodiment, a preferred trajectory may be a linear interpolation of optical frequency versus data point.

Illustrative embodiments of an invention are disclosed herein. One of ordinary skill in the art will readily recognize that the invention may have other applications in other environments. In fact, many embodiments and implementations are possible. The following claims are in no way intended to limit the scope of the present invention to the specific embodiments described above. In addition, any recitation of "means for" is intended to evoke a means-plus-function reading of an element and a claim, whereas, any elements that do not specifically use the recitation "means for", are not intended to be read as means-plus-function elements, even if the claim otherwise includes the word "means". It should also be noted that although the specification lists method steps occurring in a particular order, these steps may be executed in any order, or at the same time.

Although the invention is shown and described with respect to illustrative embodiments, it is evident that equivalents and modifications will occur to those persons skilled in the art upon the reading and understanding hereof. The present invention includes all such equivalents and modifications and is limited only by the scope of the claims if appended hereto.

What is claimed is:

1. A laser system comprising:
   a multi-section semiconductor laser comprising a front mirror section, a back mirror section and a phase section, wherein the laser is operable to discretely sweep over a range of wavelengths;
   one or more current sources for outputting a current to at least one of the front mirror section, the back mirror section and the phase section;
   an external power meter coupled to the laser;
   an external wavelength meter coupled to the laser;
   a controller coupled to the laser, the external power meter and the external wavelength meter, wherein the controller is configured to determine a side-mode suppression ratio for each wavelength in the range of wavelengths and to output control signals to the one or more current sources to drive the laser through an optimum sweep path, wherein the optimum sweep path maximizes side-mode suppression ratio over the range of wavelengths.

2. The system of claim 1, wherein the controller further determines a set of front mirror currents, back mirror currents and phase currents over the range of wavelengths.

3. The system of claim 2, wherein the optimum sweep path is determined from an initial wavelength to a final wavelength, wherein the initial wavelength and the final wavelength are within the range of wavelengths.

4. The system of claim 3, wherein the controller executes an algorithm to process the set of front mirror currents, back mirror currents and phase currents to determine a desired sweep of currents versus time.

5. A method for collecting and processing data from a semiconductor laser source to produce an optimized side-mode suppression ratio over a continuous range of wavelengths within a prescribed temporal profile, wherein the semiconductor laser source includes a front mirror section, a back mirror section, a phase section and a gain section, the method comprising:
   measuring laser data over the range of wavelengths, wherein the laser data includes at least one of a voltage, wavelength or power for front mirror current and back mirror current for one or more phase currents;
   storing the laser data in a data set;
   identifying laser mode bounded-regions from the data set, wherein each bounded-region is defined as a function of front mirror current and back mirror current;
   identifying one or more supermodes from the data set, wherein the laser supermodes are comprised of adjacent laser modes spaced along a diagonal in a tuning map having front mirror current indexed on a first axis and back mirror current indexed on a second axis;
   identifying at least one continuous supermode trajectory in front mirror current and back mirror current between each mode of the laser supermodes;
   measure gain voltage associated with the gain section and/or output power of the semiconductor laser for each of the at least one continuous supermode trajectory;
   determine a center for each mode bounded-region for each data set;
   measure an output wavelength of the laser source at the center of each mode and store the measurements in the data set;
   sort the measurements based on mode bounded-region for each super trajectory;
   generate a tuning table for the wavelength range of laser source;
   sort the measurements by wavelength;
   interpolate between the measured wavelengths at the mode centers to create a prescribed trajectory of laser wavelength versus data point.

6. The method of claim 5, wherein the prescribed trajectory of laser wavelength versus data point is a linear interpolation of wavelength versus data point.

7. The method of claim 5, wherein the prescribed trajectory of laser wavelength versus data point is a linear interpolation of optical frequency versus data point.

8. The method of claim 5, wherein the center determined for each mode-bounded region is the location that the side-mode suppression ratio is maximized within each mode-bounded region.

* * * * *